(12) United States Patent
An (10) Patent No.: US 12,550,279 B2
(45) Date of Patent: Feb. 10, 2026

(54) BATTERY PACK (71) Applicant: SAMSUNG SDI CO., LTD., Yongin-si (KR)

(72) Inventor: Kangsik An, Yongin-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 330 days.

(21) Appl. No.: 17/319,342

(22) Filed: May 13, 2021

(65) Prior Publication Data

US 2021/0368643 A1 Nov. 25, 2021

(30) Foreign Application Priority Data

May 21, 2020 (KR) .................. 10-2020-0061144

(51) Int. Cl.
*H05K 7/14* (2006.01)
*H01M 10/42* (2006.01)
*H05K 1/14* (2006.01)

(52) U.S. Cl.
CPC ........ *H05K 7/1427* (2013.01); *H01M 10/425* (2013.01); *H05K 1/141* (2013.01); *H05K 1/147* (2013.01); *H05K 2201/10037* (2013.01)

(58) Field of Classification Search
CPC .................................................. H05K 7/1427
See application file for complete search history.

(56) References Cited

U.S. PATENT DOCUMENTS

| | | | |
|---|---|---|---|
| 9,083,040 B2 | 7/2015 | Lee | |
| 9,099,707 B2 * | 8/2015 | Kim | H01M 50/184 |
| 9,660,302 B2 | 5/2017 | Kim et al. | |
| 9,991,567 B2 | 6/2018 | Han | |
| 10,388,938 B2 | 8/2019 | Ahn et al. | |
| 2011/0003196 A1 * | 1/2011 | Kim | |
| 2012/0045667 A1 * | 2/2012 | Yoneda | H01M 50/296 |
| | | | 429/7 |
| 2013/0011700 A1 * | 1/2013 | Park | |

(Continued)

FOREIGN PATENT DOCUMENTS

| | | |
|---|---|---|
| CN | 104969383 A | 10/2015 |
| CN | 105556709 A | 5/2016 |

(Continued)

OTHER PUBLICATIONS

Chinese Office Action dated Feb. 7, 2023.

(Continued)

*Primary Examiner* — Matthew T Martin
*Assistant Examiner* — Krishna R Hammond
(74) *Attorney, Agent, or Firm* — Lee IP Law, P.C.

(57) ABSTRACT

A battery pack including a battery cell; a main circuit board electrically connected to the battery cell and extending in a first direction; a sub-circuit board overlapping the main circuit board in parallel with the main circuit board and connected to the main circuit board through a foldable flexible wiring, the sub-circuit board including a first end connected to the flexible wiring and a second end including an external input/output terminal thereon; and a board holder accommodating the main circuit board, the board holder including a catch tab thereon, wherein the catch tab is configured to physically interfere with the sub-circuit board that overlaps the main circuit board.

18 Claims, 8 Drawing Sheets

(56) References Cited

U.S. PATENT DOCUMENTS

| | | | |
|---|---|---|---|
| 2014/0220391 A1* | 8/2014 | Fujii | H01M 50/264 |
| | | | 429/7 |
| 2015/0064504 A1* | 3/2015 | Kim | |
| 2016/0233479 A1 | 8/2016 | Ahn et al. | |
| 2016/0308255 A1 | 10/2016 | Han | |
| 2018/0183112 A1 | 6/2018 | Cheong et al. | |
| 2019/0027731 A1* | 1/2019 | Zeng | H01M 50/51 |
| 2020/0014001 A1 | 1/2020 | Yang | |

FOREIGN PATENT DOCUMENTS

| | | | |
|---|---|---|---|
| JP | 2004-193066 A | | 7/2004 |
| JP | 2007287825 A * | | 11/2007 |
| JP | 2010146774 A * | | 7/2010 |
| JP | 2011-187461 A | | 9/2011 |
| KR | 10 2011 0003897 A | | 1/2011 |
| KR | 10-2013-0113975 A | | 10/2013 |
| KR | 10 2015 0035182 A | | 4/2015 |
| KR | 10-2016-0123788 A | | 10/2016 |
| KR | 20160123788 A * | | 10/2016 |
| KR | 10-2018-0074239 A | | 7/2018 |
| KR | 10-2018-0113424 A | | 10/2018 |
| KR | 10 2018 0137313 A | | 12/2018 |
| WO | WO-2018186604 A1 * | 10/2018 | H01M 10/425 |

OTHER PUBLICATIONS

Korean Office action dated Apr. 11, 2025, for corresponding KR Patent Application No. 10-2020-0061144.
Korean Notice of Allowance dated Dec. 3, 2025.

* cited by examiner

BATTERY PACK

CROSS-REFERENCE TO RELATED APPLICATION

Korean Patent Application No. 10-2020-0061144, filed on May 21, 2020 in the Korean Intellectual Property Office, and entitled: "Battery Pack," is incorporated by reference herein in its entirety.

BACKGROUND

1. Field

Embodiments relate to a battery pack.

2. Description of Related Art

In general, secondary batteries refer to batteries that can be repeatedly charged and recharged, unlike non-rechargeable primary batteries. Secondary batteries may be used as energy sources of devices such as mobile devices, electric vehicles, hybrid electric vehicles, electric bicycles, and uninterruptible power supplies. Single-cell secondary batteries or multi-cell secondary batteries (battery packs), each including a plurality of cells connected to each other as a unit, may be used according to the types of devices that employ secondary batteries.

Small mobile devices such as cellular phones may be operated for a predetermined time using single-cell secondary batteries. However, battery packs having high-output, high-capacity features may be suitable for devices having long operating times and consuming large amounts of power such as electric vehicles and hybrid electric vehicles. The output voltages or currents of battery packs may be increased by adjusting the number of battery cells included in the battery packs.

SUMMARY

The embodiments may be realized by providing a battery pack including a battery cell; a main circuit board electrically connected to the battery cell and extending in a first direction; a sub-circuit board overlapping the main circuit board in parallel with the main circuit board and connected to the main circuit board through a flexible wiring, the sub-circuit board including a first end connected to the flexible wiring and a second end including an external input/output terminal thereon; and a board holder accommodating the main circuit board, the board holder including a catch tab thereon, wherein the catch tab is configured to physically interfere with the sub-circuit board that overlaps the board holder.

The board holder may extend in the first direction parallel to the main circuit board.

The board holder may further include a first main wall and a second main wall extending in the first direction and facing each other, the first main wall and the second main wall accommodating the main circuit board therebetween; a first terminating end and a second terminating end between ends of the first main wall and the second main wall; a bottom surrounded by the first main wall and the second main wall and the first terminating end and the second terminating end; and an opening opposite to the bottom, the opening being open to accommodate the main circuit board.

The first terminating end at which the board holder terminates in the first direction from the main circuit board toward the flexible wiring may include an end opening.

The end opening may provide a passage through which the main circuit board accommodated in the board holder is connected to the sub-circuit board overlapping the board holder.

The flexible wiring may pass through the end opening and connects the main circuit board with the sub-circuit board, which are arranged inside and outside the board holder.

The first terminating end may include a rounded portion having a rounded shape.

The flexible wiring may pass through the end opening and may be folded around the rounded portion of the first terminating end.

A main portion of the sub-circuit board may be on the first main wall.

The catch tab may be on the first main wall.

The catch tab may be configured to physically interfere with the second end of the sub-circuit board.

The first main wall may include a middle opening into which the second end of the sub-circuit board is insertable, and the catch tab may be a middle opening wall defining one side of the middle opening.

The middle opening may be between both ends of the board holder in the first direction.

A main portion of the sub-circuit board may be on the first main wall, and the second end of the sub-circuit board may be inserted into the first main wall through the middle opening such that the second end is fitted between the main circuit board and the catch tab.

The board holder may further include a protruding rib that protrudes from the first main wall and is configured to physically interfere with the sub-circuit board on the first main wall.

The protruding rib may be at one widthwise end of the first main wall in a second direction crossing the first direction.

The sub-circuit board may include a recess into which the protruding rib is insertable.

The recess may be at one widthwise end of the sub-circuit board in a second direction crossing the first direction.

The recess may be in an edge of the sub-circuit board and is open in an outward direction.

The main circuit board may be a rigid circuit board, and the sub-circuit board and the flexible wiring may be a flexible single circuit board.

BRIEF DESCRIPTION OF THE DRAWINGS

Features will be apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present. Like reference numerals refer to like elements throughout.

As used herein, the terms "or" and "and/or" include any and all combinations of one or more of the associated listed items. Expressions such as "at least one of," when preceding a list of elements, modify the entire list of elements and do not modify the individual elements of the list.

Hereinafter, a battery pack will be described according to embodiments with reference to the accompanying drawings.

Figure 1:
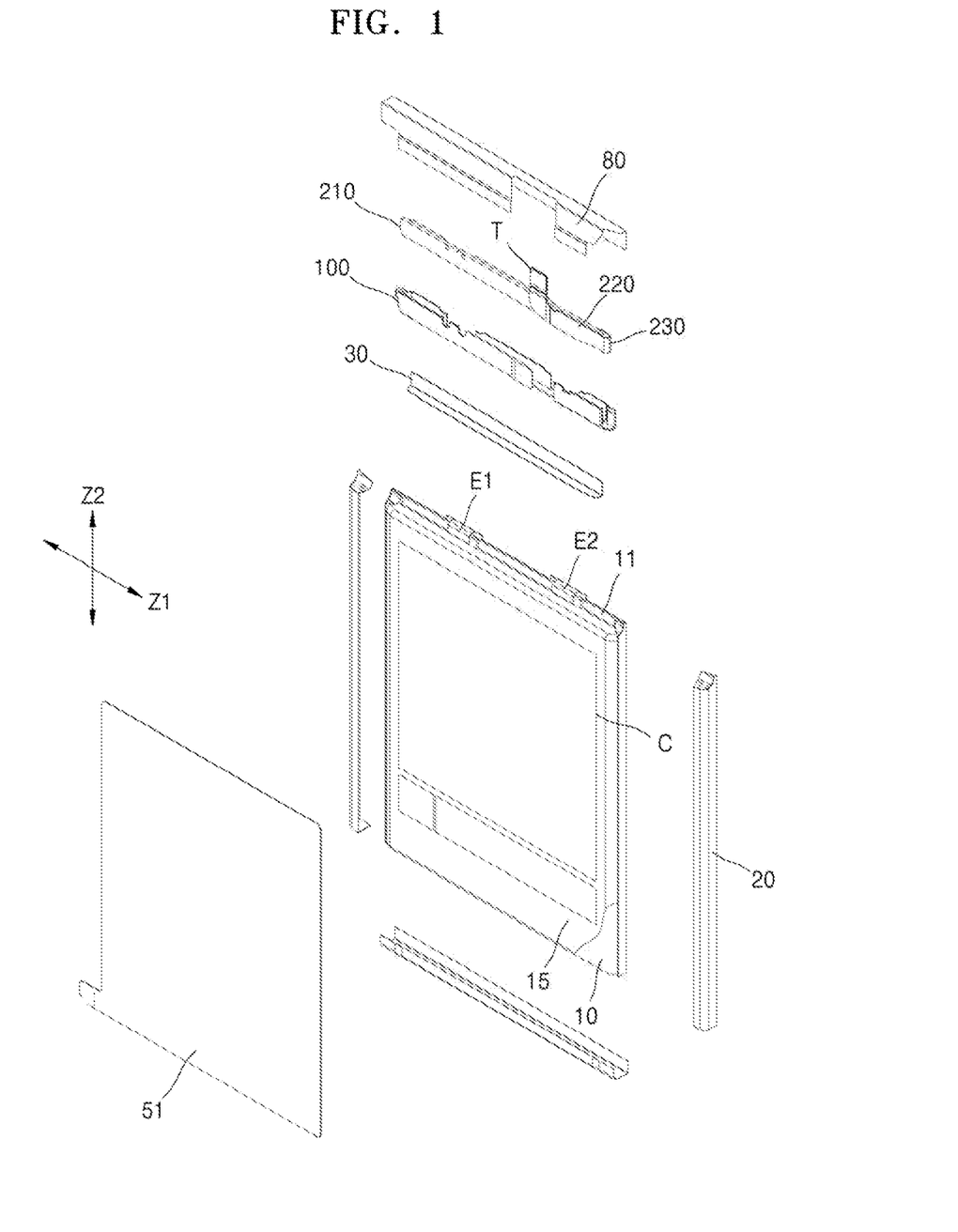
FIG. 1 is an exploded perspective view of a battery pack according to an embodiment.
Figure 2:
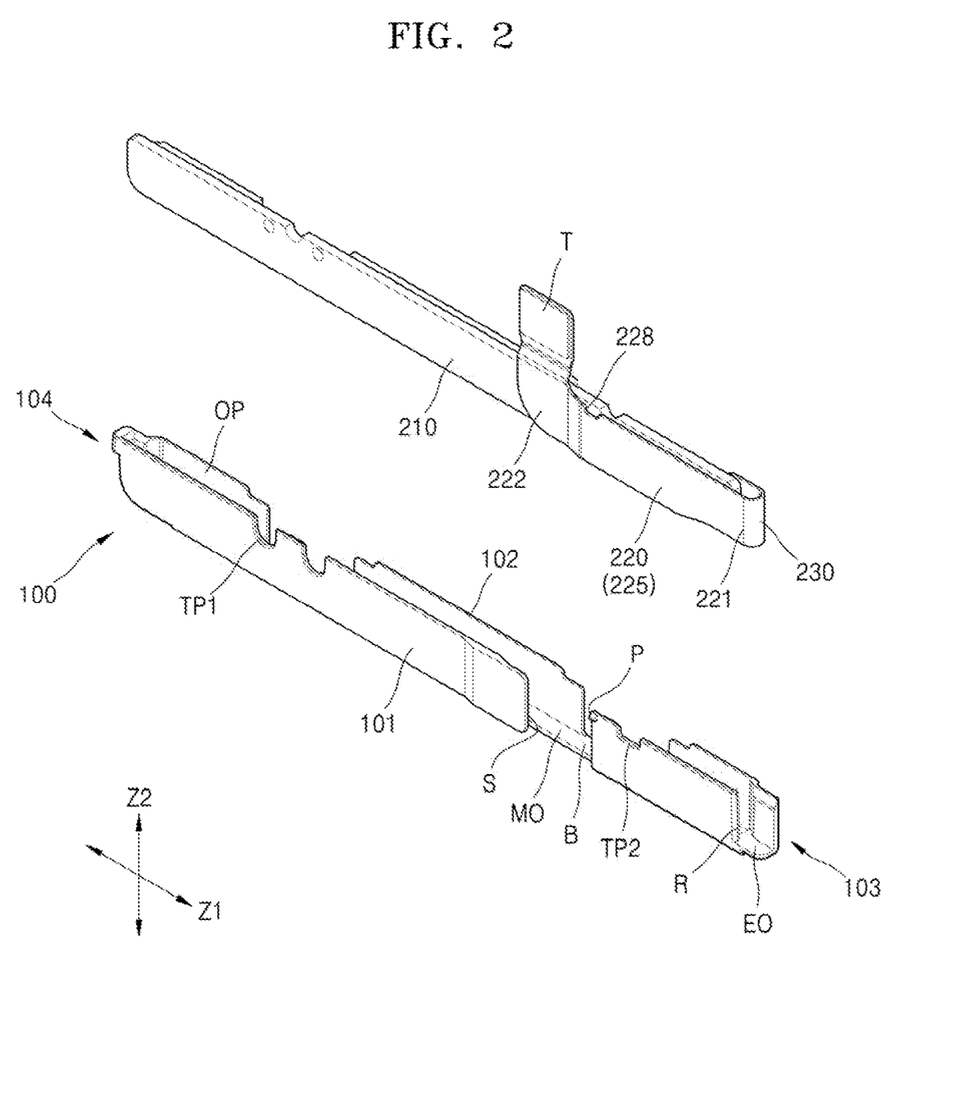
FIG. 2 is an exploded perspective view of a portion of the battery pack shown in FIG. 1.
Figure 3A:
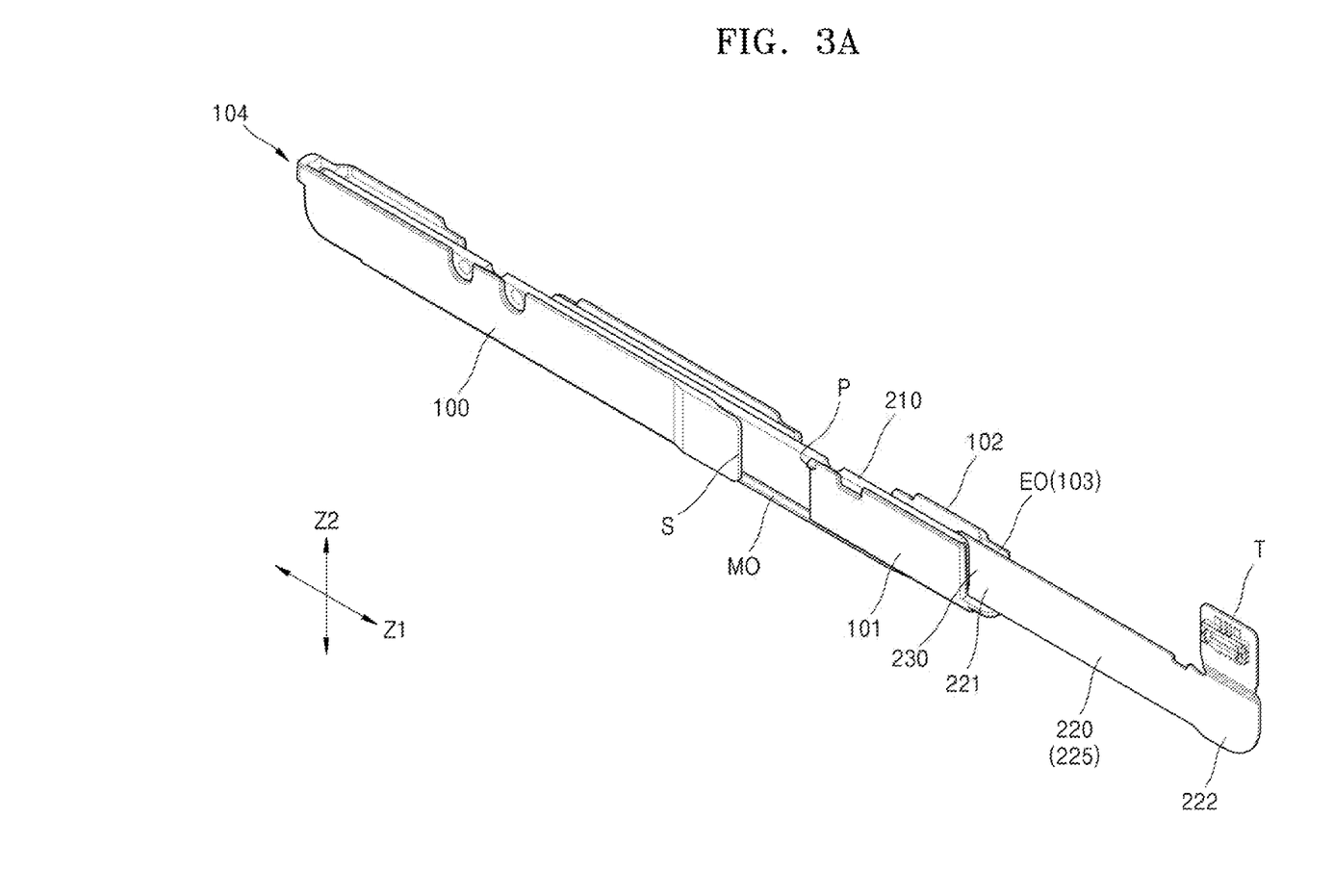
FIGS. 3A and 3B are a perspective view and a plan view of a state in which a sub-circuit board shown in FIG. 2 is unfolded.
Figure 3B:
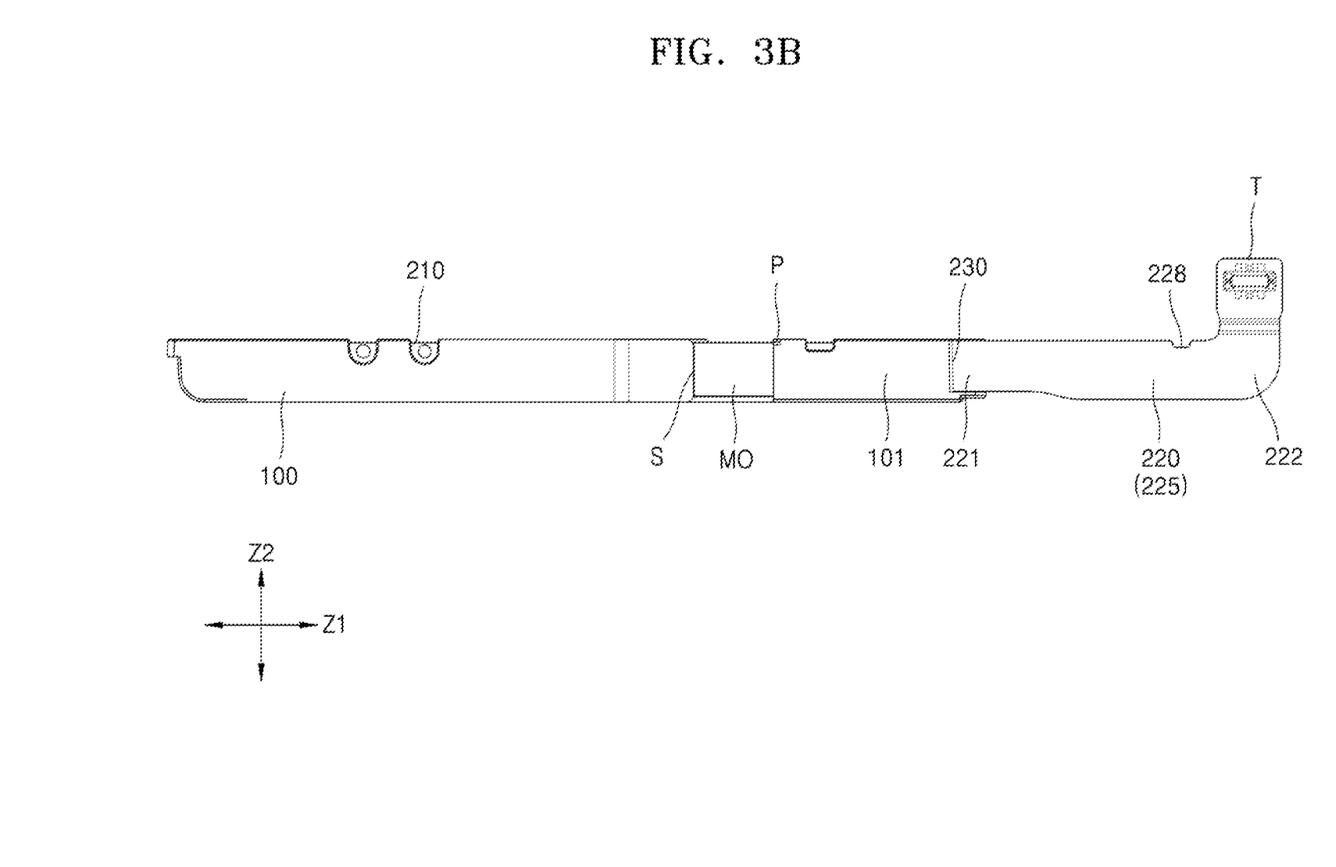
Figure 4A:
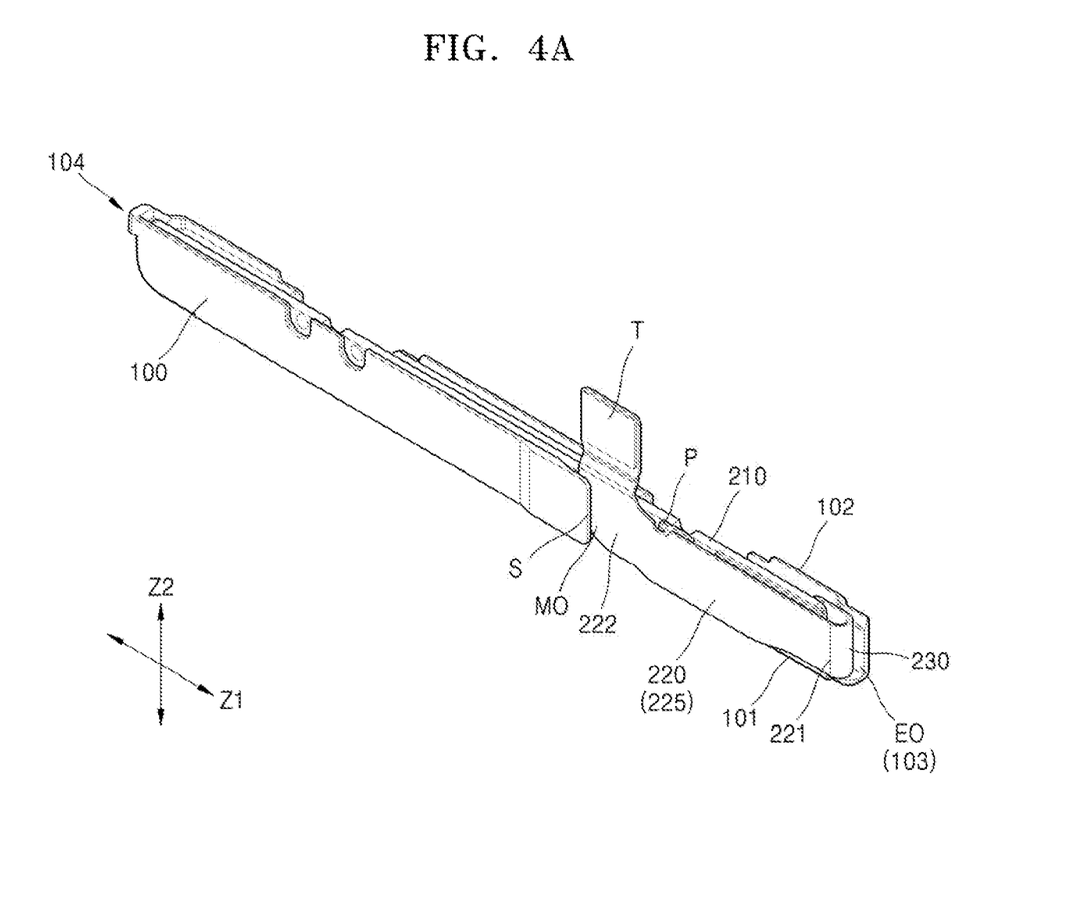
FIGS. 4A and 4B are a perspective view and a plan view of a state in which a sub-circuit board shown in FIG. 2 is folded.
Figure 4B:
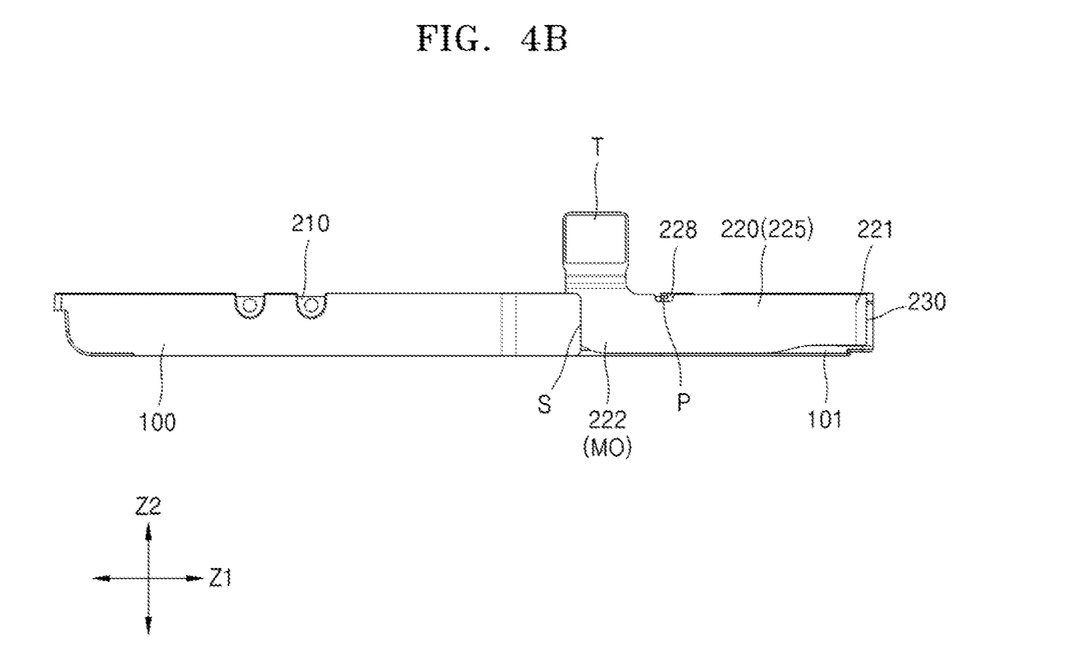
Figure 5:
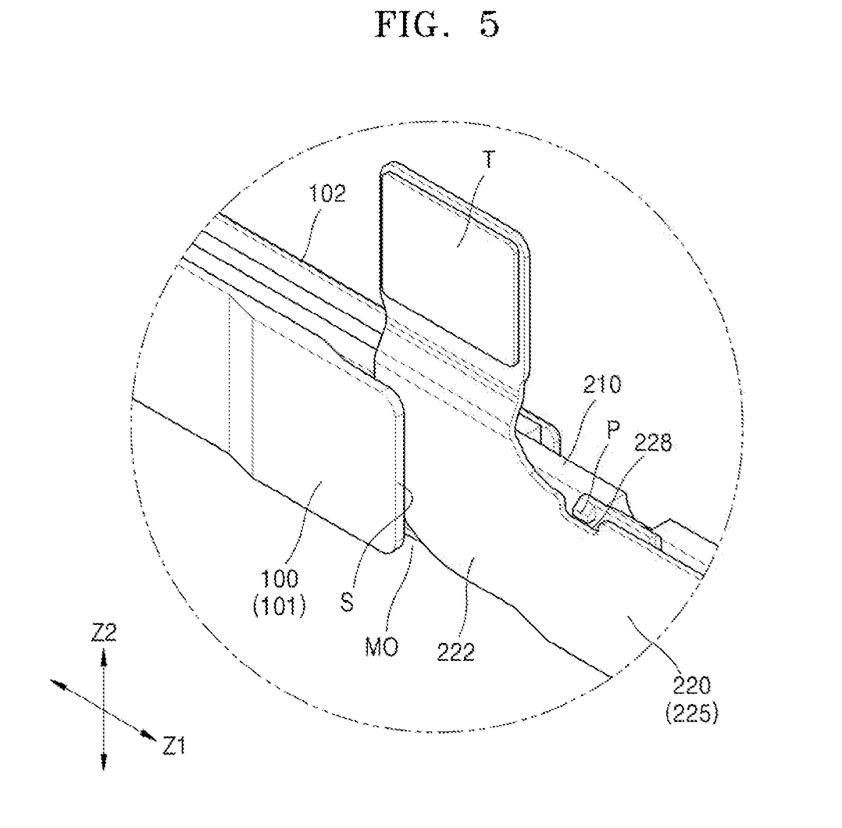
FIG. 5 is an enlarged view of physical interference between the sub-circuit board and a catch tab, which are shown in FIG. 2.
Figure 6:
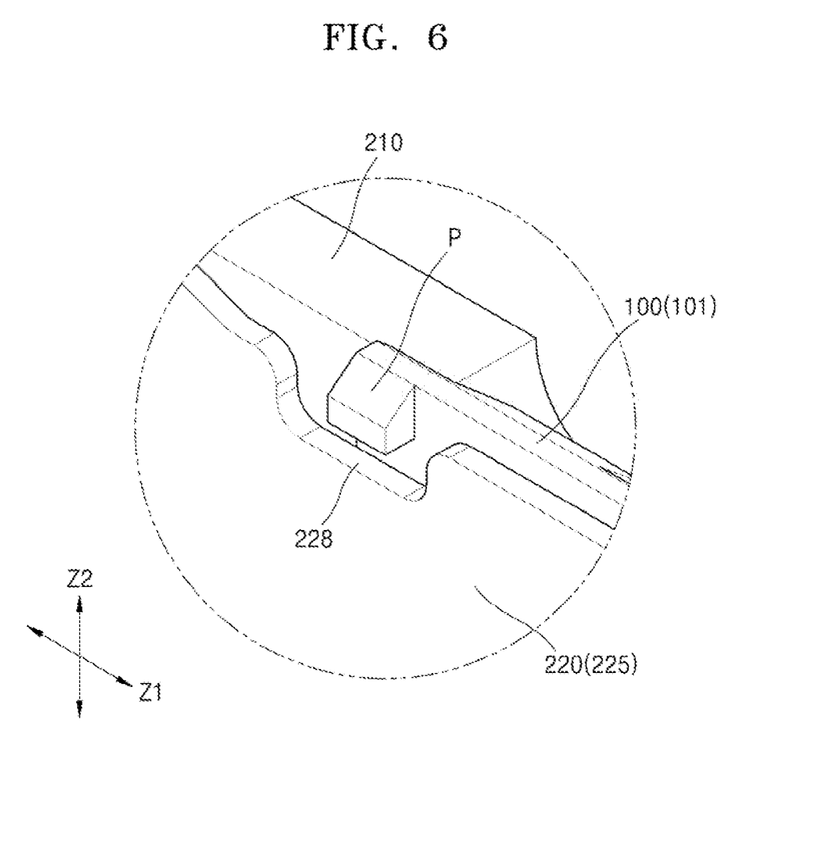
FIG. 6 is an enlarged view of physical interference between the sub-circuit board and a protruding rib, which are shown in FIG. 2.

FIG. 1 is an exploded perspective view of a battery pack according to an embodiment. FIG. 2 is an exploded perspective view of a portion of the battery pack shown in FIG. 1. FIGS. 3A and 3B are a perspective view and a plan view of a state in which a sub-circuit board shown in FIG. 2 is unfolded. FIGS. 4A and 4B are a perspective view and a plan view of a state in which a sub-circuit board 220 shown in FIG. 2 is folded. FIG. 5 is an enlarged view of physical interference between the sub-circuit board and a catch tab S, which are shown in FIG. 2. FIG. 6 is an enlarged view of physical interference between the sub-circuit board and a protruding rib P, which are shown in FIG. 2.

Referring to FIGS. 1 and 2, according to an embodiment, the battery pack may include: a battery cell C; a main circuit board 210 electrically connected to the battery cell C and extending (e.g., lengthwise) in a first direction Z1; and a sub-circuit board 220 overlapping the main circuit board 210 in parallel with the main circuit board 210 and connected to the main circuit board 210 through a foldable flexible wiring portion or flexible wiring 230, In an implementation, the sub-circuit board 220 may include a first end portion or end 221 connected to the flexible wiring 230 and a second end portion or end 222 including an external input/output terminal T thereon. The battery pack may further include a board holder 100 that accommodates the main circuit board 210 and includes the catch tab S thereon, the catch tab S being configured to physically interfere with (e.g., press or hold) the sub-circuit board 220 overlapping the board holder 100. In an implementation, the catch tab S may help prevent unfolding of the sub-circuit board 220 in a direction in which the sub-circuit board 220 is lifted from the main circuit board 210 (e.g., may hold the folded sub-circuit board 220 against or adjacent to the main circuit board 210).

The battery cell C may include: an electrode assembly 10 and an outer casing 15 in which an electrolyte is sealed together with the electrode assembly 10. In an implementation, the outer casing 15 may include a terrace portion 11 from which first and second electrodes E1 and E2 (electrically connected to the electrode assembly 10) outwardly extend. The main circuit board 210 electrically may be connected to the first and second electrodes E1 and E2, and the board holder 100 accommodating the main circuit board 210 may be arranged on the terrace portion 11.

In an implementation, the electrode assembly 10 may include first and second electrode plates having different polarities, and a separator between the first and second electrode plates. The electrode assembly 10 may be formed in a roll type by winding the first and second electrode plates with the separator therebetween, or in a stacked type by stacking a plurality of first and second electrode plates with separators therebetween.

The main circuit board 210 (to which the first and second electrodes E1 and E2 are connected) and the board holder 100 (in which the main circuit board 210 is accommodated) may be arranged on the terrace portion 11 (from which the first and second electrodes E1 and E2 of the battery cell C outwardly extend). A charge-discharge path of the battery cell C may be connected, through the main circuit board 210 connected to the first and second electrodes E1 and E2, to the external input/output terminal T of the sub-circuit board 220 (overlapping the main circuit board 210).

The main circuit board 210 may be electrically connected to the battery cell C and may be a part of the charge-discharge path of the battery cell C, e.g., may be connected to the first and second electrodes E1 and E2 of the battery cell C. The main circuit board 210 may be electrically connected to the sub-circuit board 220 (including the external input/output terminal T thereon) and may form a part of the charge-discharge path between the battery cell C and the external input/output terminal T of the sub-circuit board 220. The main circuit board 210 may be on the terrace portion 11 of the battery cell C (from which the first and second electrodes E1 and E2 outwardly extend), and may extend (e.g., lengthwise) in the first direction Z1, which is parallel to a lengthwise extension direction of the terrace portion 11. As described below, the sub-circuit board 220 electrically connected to the main circuit board 210 may also extend (e.g., lengthwise) in the first direction Z1, e.g., parallel to the main circuit board 210. For reference, throughout the present specification, the first direction Z1 may refer to the lengthwise direction of the main circuit board 210 and the sub-circuit board 220, and when used in a limited sense with a more specific definition, the first direction Z1 may refer to a direction from the main circuit board 210 toward the flexible wiring 230. In addition, the second direction Z2 may refer to a widthwise direction of the main circuit board 210 and the sub-circuit board 220, and may be a direction crossing the first direction Z1, e.g., perpendicularly crossing the first direction Z1.

Unlike the sub-circuit board 220, the main circuit board 210 may be a, e.g., relatively, rigid circuit board, and a plurality of circuit devices may be arranged on the main circuit board 210 such that the main circuit board 210 may control the charge and discharge operation of the battery cell C in response to abnormal situations such as overheating, overcharging, or overdischarging of the battery cell C while the main circuit board 210 forms the charge-discharge path between the battery cell C and the sub-circuit board 220. In an implementation, the main circuit board 210 may function as a battery management system (BMS) that monitors status information such as the temperature, voltage, and current of the battery cell C and may facilitate protective measures such as stopping the charge or discharge operation of the battery cell C when the BMS detects abnormal situations. In an implementation, the main circuit board 210 may be a relatively rigid circuit board, unlike the sub-circuit board 220. In an implementation, the main circuit board 210 may be a flexible circuit board like the sub-circuit board 220.

The sub-circuit board 220 may extend parallel to the main circuit board 210 in the first direction Z1, and may overlap the main circuit board 210 in parallel. In an implementation, the sub-circuit board 220 may overlap the main circuit board 210 through the foldable flexible wiring 230, e.g., the sub-circuit board 220 may be folded around to overlap and be parallel with the main circuit board. In an implementation, the flexible wiring 230 and the sub-circuit board 220 may be a one piece, monolithic structure, and the flexible wiring 230 and the sub-circuit board 220 may be one, single flexible circuit board. In an implementation, an end of the flexible circuit board may be in the form of a flexible film, may be folded from the main circuit board 210 and connects another portion of the flexible circuit board and the main circuit board 210 to each other, may correspond to the flexible wiring 230, and the other portion of the flexible circuit board may correspond to the sub-circuit board 220. In an implementation, the flexible circuit board, e.g., the flexible wiring 230 and the sub-circuit board 220, may be in the form of a flexible film, and may thus be foldable.

In an implementation, in the flexible circuit board, e.g., in which the flexible wiring 230 and the sub-circuit board 220 are a one piece structure, an end connected to the main circuit board 210 and extending in a curved form from the main circuit board 210 may correspond to the flexible wiring 230, and the remaining portion extending (e.g., lengthwise) in the first direction Z1 from the end of the flexible wiring 230 may correspond to the sub-circuit board 220.

In an implementation, in the flexible circuit board, e.g., in which the flexible wiring 230 and the sub-circuit board 220 are a one piece structure, a position at which folding or bending of the flexible circuit board is terminated, e.g., a position at which the flexible circuit board bent from the main circuit board 210 starts to extend flat or straight in the first direction Z1, may correspond to a boundary between the flexible wiring 230 and the sub-circuit board 220. In an implementation, the boundary between the flexible wiring 230 and the sub-circuit board 220 may correspond to the first end 221 of the sub-circuit board 220.

In an implementation, the sub-circuit board 220 may be a relatively rigid circuit board like the main circuit board 210, and the flexible wiring 230 may be a flexible-film circuit board that is foldable between the main circuit board 210 and the sub-circuit board 220 (e.g., the rigid circuit boards). In an implementation, the flexible wiring 230 may be a flexible-film circuit board which is foldable, and the sub-circuit board 220 may also be formed as a flexible circuit board like the flexible wiring 230. In an implementation, the flexible wiring 230 and the sub-circuit board 220 may be formed from or as a single flexible circuit board.

The sub-circuit board 220 may include the first end 221 connected to the flexible wiring 230, and the second end 222 including the external input/output terminal T thereon. The sub-circuit board 220 may be connected to the main circuit board 210 through the flexible wiring 230, and may form the charge-discharge path between the main circuit board 210 and the external input/output terminal T. The flexible wiring 230 may be arranged between the main circuit board 210 and the sub-circuit board 220 and may electrically connect the main circuit board 210 and the sub-circuit board 220 to each other. In an implementation, the flexible wiring 230 may be connected to the main circuit board 210 and the sub-circuit board 220 by a thermal bonding method such as welding or soldering. In an implementation, the flexible wiring 230 may be arranged between the first end 221 of the sub-circuit board 220 and an end of the main circuit board 210 in the first direction Z1, e.g., in the first direction Z1 from the main circuit board 210 toward the flexible wiring 230. In an implementation, the flexible wiring 230 and the sub-circuit board 220 may be formed as one flexible circuit board, and in this case, the flexible wiring 230 and the sub-circuit board 220 may be a one piece flexible circuit board, and an additional process such as a welding or soldering process may not be used for connecting the flexible wiring 230 and the sub-circuit board 220 to each other.

The sub-circuit board 220 may be overlap the main circuit board 210 by folding at the flexible wiring 230. Throughout the present specification, folding or unfolding of the sub-circuit board 220 may practically refer to folding or unfolding of the flexible wiring 230 for allowing the sub-circuit board 220 to overlap the main circuit board 210 (e.g., folding, refer to FIGS. 4A and 4B) or lifting or randomly moving the sub-circuit board 220 away from the main circuit board 210 (e.g., unfolding, refer to FIGS. 3A and 3B). For reference, FIGS. 3A and 3B illustrate a state in which the sub-circuit board 220 is fully unfolded into the same plane as the main circuit board 210. In an implementation, the battery pack may be provided by folding the sub-circuit board 220 as shown in FIGS. 4A and 4B from a state in which the sub-circuit board 220 is unfolded as shown in FIGS. 3A and 3B, and in this regard, FIGS. 3A, 3B, 4A, and 4B may be understood as views sequentially illustrating some processes for forming the battery pack according to an embodiment. In addition, throughout the present specification, the folding or unfolding of the sub-circuit board 220 may practically mean the folding or unfolding of or at the flexible wiring 230, and for ease of understanding, the folding or unfolding of the flexible wiring 230 may hereinafter be referred to as the folding or unfolding of the sub-circuit board 220.

In an implementation, referring to FIG. 2, the battery pack may include the board holder 100 that includes the catch tab S configured to maintain a folded state in which the sub-circuit board 220 is folded to overlap the main circuit board 210 and help prevent the sub-circuit board 220 from being unfolded upward, outward, or away from the main circuit board 210. Throughout the present specification, the description of the sub-circuit board 220 overlapping the main circuit board 210 or the sub-circuit board 220 being folded onto the main circuit board 210 may mean that the sub-circuit board 220 overlaps the board holder 100 in which the main circuit board 210 is accommodated or the sub-circuit board 220 is folded onto the board holder 100 in which the main circuit board 210 is accommodated.

The board holder 100 may accommodate the main circuit board 210 or at least a portion of the main circuit board 210 to help insulate and protect the main circuit board 210. The board holder 100 may be on the terrace portion 11 of the battery cell C together with the main circuit board 210.

Referring to FIG. 2, the board holder 100 may extend (e.g., lengthwise) in the first direction Z1 parallel to the main circuit board 210, and may include, e.g., a first main wall 101 and a second main wall 102 that extend (e.g., lengthwise) in the first direction Z1 while facing each other, and may accommodate the main circuit board 210 therebetween. The board holder 100 may include a first terminating end 103 and a second terminating end 104 between ends of the first and second main walls 101 and 102 in the first direction Z1. The board holder 100 may further include a bottom B surrounded by the first and second main walls 101 and 102 and the first and second terminating ends 103 and 104; and an open portion or opening OP opposite the bottom B and is open to accommodate the main circuit board 210. In an implementation, the bottom B and the opening OP may face each other in the second direction Z2 crossing the first direction Z1 (e.g., in which the board holder 100 extends).

A round or rounded portion R may be on or at the first terminating end 103, and the first terminating end 103 may help support the flexible wiring 230, which may be folded around the rounded portion R. In an implementation, the rounded portion R may be on or at the first terminating end 103, e.g., at which the board holder 100 terminates in the first direction Z1, and the rounded portion R may help support the flexible wiring 230, which may be folded around the rounded portion R. In an implementation, the rounded portion R may have a rounded shape over the entirety or a portion of the first terminating end 103.

An end opening EO may be in or at the first terminating end 103. The end opening EO may provide a passage through which the main circuit board 210 (accommodated in the board holder 100) may be connected to the sub-circuit board 220, e.g., the flexible wiring 230 may be inserted or may extend through the end opening EO such that the main circuit board 210 and the sub-circuit board 220 (which may be arranged inside and outside the board holder 100) may be connected to each other through the flexible wiring 230.

In an implementation, the end opening EO may be in or at the first terminating end 103 (at which the board holder 100 terminates in the first direction Z1). The end of the main circuit board 210 or the flexible wiring 230 connected to the end of the main circuit board 210 may extend outwardly from the board holder 100 through the end opening EO, and as the flexible wiring 230 extending outward from the board holder 100 is folded, the flexible wiring 230 may be connected to the sub-circuit board 220 overlapping or folded around the board holder 100.

In an implementation, the flexible wiring 230 passing through the end opening EO may be folded onto or around the board holder 100 while surrounding the rounded portion R of the first terminating end 103 (in or at which the end opening EO is formed). In an implementation, the rounded portion R of the first terminating end 103 may help guide the folding of the flexible wiring 230 (which passes through the end opening EO). In an implementation, the flexible wiring 230 may surround or be folded around the rounded portion R of the first terminating end 103, which has a suitable radius of curvature, and the flexible wiring 230 may be folded in a shape having a suitable radius of curvature and may not be unexpectedly folded due to an external impact such that the radius of curvature of the flexible wiring 230 may be stably supported and the flexible wiring 230 may not be damaged.

The sub-circuit board 220 may be arranged on the board holder 100. In an implementation, the sub-circuit board 220 may be on an outer surface of the first main wall 101 of the board holder 100. As described in greater detail below, the second end 222 of the sub-circuit board 220 may be inserted into the first main wall 101 (e.g., between the first main wall 101 and the second main wall 102) through the catch tab S, and a main portion 225 of the sub-circuit board 220, which occupies most of the sub-circuit board 220 except for the second end 222 of the sub-circuit board 220, may be arranged on the outer surface of the first main wall 101. In an implementation, the first end 221 of the sub-circuit board 220 may be connected to the flexible wiring 230, and the first end 221 of the sub-circuit board 220 may be included in the main portion 225 of the sub-circuit board 220.

The catch tab S may be on the first main wall 101 of the board holder 100 to help prevent the sub-circuit board 220 from being lifted, unfolded, or moved away from the main circuit board 210 (or the first main wall 101 of the board holder 100). In an implementation, the catch tab S may be on the first main wall 101 on which the sub-circuit board 220 is arranged or faces. In an implementation, the catch tab S may be configured to physically interfere with (e.g., hold or press) the second end 222 of the sub-circuit board 220, which extends away from the first end 221 of the sub-circuit board 220 connected to the flexible wiring 230. In an implementation, the catch tab S may be configured to physically interfere with the second end 222 of the sub-circuit board 220, which corresponds to the opposite side of the flexible wiring 230, and the catch tab S may form a distant moment arm capable of effectively preventing unfolding of the flexible wiring 230. In an implementation, the external input/output terminal T may be on the second end 222 of the sub-circuit board 220, and the catch tab S of the board holder 100 may physically interfere with the second end 222 of the sub-circuit board 220 on which the external input/output terminal T is formed.

In an implementation, a middle opening MO, into which the second end 222 of the sub-circuit board 220 is insertable, may be in the first main wall 101 of the board holder 100. In an implementation, the catch tab S may be a middle opening wall defining the middle opening MO. In an implementation, the middle opening MO may be in the first main wall 101 of the board holder 100 on which the sub-circuit board 220 is arranged, and the middle opening MO may be between both, e.g., opposite, ends of the board holder 100, e.g., between the first and second terminating ends 103 and 104 of the board holder 100. In an implementation, the main portion 225 of the sub-circuit board 220 may be on or face the outer surface of the first main wall 101, and the second end 222 of the sub-circuit board 220 may be inserted into the first main wall 101 through the middle opening MO in the first main wall 101 and may be fitted between the main circuit board 210 and the catch tab S formed as the middle opening wall. In an implementation, the second end 222 of the sub-circuit board 220 may be inserted between the middle opening wall (corresponding to the catch tab S) and the main circuit board 210, the second end 222 of the sub-circuit board 220 may be pressed toward or held adjacent to the main circuit board 210, and the sub-circuit board 220 may not be unfolded, e.g., lifted or moved away from the main circuit board 210. In an implementation, the middle opening wall that physically interfere with the second end 222 of the sub-circuit board 220 may correspond to the catch tab S according to an embodiment.

In an implementation, the middle opening wall (corresponding to the catch tab S) may have a stepped shape in a direction away from the second main wall 102 of the board holder 100 (e.g., may be spaced apart from the second main wall 102 by a distance greater than a distance that the first main wall 101 is spaced apart from the second main wall 102). In an implementation, the middle opening wall (corresponding to the catch tab S) may be a part of the first main wall 101 of the board holder 100, and a portion of the first main wall 101 as the middle opening wall, may have a stepped shape in a direction away from the second main wall 102, with respect to other portions of the first main wall 101 adjacent to the first and second terminating ends 103 and 104 of the board holder 100. In an implementation, the middle opening wall (corresponding to the catch tab S) may have a stepped shape, an additional space may be guaranteed or provided between the middle opening wall and the second main wall 102, and the second end 222 of the sub-circuit board 220 may be fitted in the additional space.

In an implementation, the catch tab S may correspond to a suitable structure configured to physically interfere with the second end 222 of the sub-circuit board 220 for preventing the sub-circuit board 220 from being lifted from the main circuit board 210 or otherwise unfolded, e.g., the catch tab S may correspond to the middle opening wall around the middle wall MO into which the second end 222 of the sub-circuit board 220 may be fitted, or a hook structure into which the second end 222 of the sub-circuit board 220 may be fitted.

In an implementation, the catch tab S may be on the board holder 100 to help prevent the sub-circuit board 220 from being lifted from the main circuit board 210 or the board holder 100 or from being unfolded in a direction away from the main circuit board 210 or the board holder 100, and the protruding rib P (for preventing wobbling of the sub-circuit board 220) may be on the board holder 100 together with the catch tab S. In an implementation, the sub-circuit board 220 on the first main wall 101 of the board holder 100 may not be firmly fixed to the first main wall 101 of the board holder 100 but could wobble on the first main wall 101 of the board holder 100, e.g., in a plane defined by the first and second directions Z1 and Z2. In an implementation, the first end 221 of the sub-circuit board 220 may be connected to the main circuit board 210 and the second end 222 of the sub-circuit board 220 may physically interfere with the catch tab S, the sub-circuit board 220 could wobble much more in the second direction Z2 than in the first direction Z1. In an implementation, the protruding rib P for preventing wobbling of the sub-circuit board 220 may be on the first main wall 101 at a widthwise end position in the second direction Z2. In an implementation, the protruding rib P may protrude from the outer surface of the first main wall 101 and may physically interfere with or hold the sub-circuit board 220 on the outer surface of the first main wall 101. The protruding rib P may be on the first main wall 101 (on or adjacent to which the sub-circuit board 220 may be arranged), and may physically interfere with the sub-circuit board 220 to help reduce or prevent wobbling of the sub-circuit board 220 on the first main wall 101.

The protruding rib P may be between the opposite ends of the board holder 100 in the first direction Z1, e.g., between the first and second terminating ends 103 and 104. In an implementation, the protruding rib P may be at a position adjacent to the second end 222 of the sub-circuit board 220. In an implementation, the middle opening MO may be between the first and second terminating ends 103 and 104 of the board holder 100, the catch tab S may be on a wall defining the middle opening MO, and the protruding rib P may be on another wall defining the middle opening MO. Throughout the present specification, the walls defining the middle opening MO may refer to portions of the first main wall 101 that are adjacent to the middle opening MO.

In an implementation, the protruding rib P may physically interfere with the sub-circuit board 220 and may be fitted into a recess 228 in the sub-circuit board 220. In an implementation, the recess 228 may be at a position adjacent or proximate to the second end 222 of the sub-circuit board 220 and may be at one widthwise end (e.g., a top end or side) of the sub-circuit board 220 in the second direction Z2. In an implementation, the recess 228 may be in an edge of the sub-circuit board 220 and may have an open, e.g., groove, shape rather than a closed shape such as a hole.

Referring to FIG. 1, insulating tapes 20 may be attached to edges of the battery cell C, and an insulating adhesive tape 30 may be between the terrace portion 11 of the battery cell C and the board holder 100 for coupling between the terrace portion 11 and the board holder 100. In an implementation, an insulating member 80 may be attached to the board holder 100 (in which the main circuit board 210, the sub-circuit board 220, and the flexible wiring 230 are supported), such that the main circuit board 210, the sub-circuit board 220, and the flexible wiring 230 may be insulated and protected from surrounding, e.g., external, environmental agents. Referring to FIG. 1, a label sheet 51 may be attached to the battery cell C to insulate and protect the battery cell C and provide a display area for displaying product information such as a model name or a manufacturer of the battery cell C.

Referring to FIG. 2, test points TP1 and TP2 for the main circuit board 210 or the sub-circuit board 220 are illustrated, and the test points TP1 and TP2 may be openings through which portions of the main circuit board 210 or the sub-circuit board 220, e.g., terminals of the main circuit board 210 or the sub-circuit board 220, may be exposed for inspection of performance abnormalities of the main circuit board 210 or the sub-circuit board 220, e.g., performance abnormalities of components mounted on the main circuit board 210 or the sub-circuit board 220.

In an implementation, an improved circuit board support structure of the battery pack may be provided such that the sub-circuit board 220 folded onto the main circuit board 210 may not be lifted, unfolded, or randomly (e.g., undesirably) moved away from the main circuit board 210.

According to one or more of the above embodiments, a support structure for the sub-circuit board 220 may be included by forming the catch tab S or the protruding rib P on the board holder 100 (accommodating the main circuit board 210) so as to help reduce or prevent lifting, unfolding, or random movement of the sub-circuit board 220, such that the circuit board support structure of the battery pack may be improved without increasing the manufacturing costs of the battery pack.

One or more embodiments may provide a battery pack which has an improved circuit board support structure for preventing a sub-circuit board folded on a main circuit board from being lifted, unfolded, or randomly moved away from the main circuit board.

One or more embodiments may provide a battery pack which has a circuit board support structure improved without increasing the manufacturing costs of the battery pack.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A battery pack, comprising:
a battery cell;
a main circuit board electrically connected to the battery cell and extending in a first direction;

a sub-circuit board overlapping the main circuit board in parallel with the main circuit board and connected to the main circuit board through a flexible wiring, the sub-circuit board including a first end connected to the flexible wiring and a second end including an external input/output terminal thereon; and a board holder accommodating the main circuit board, the board holder including:
- a first main wall and a second main wall in parallel to each other and extending in the first direction, the main circuit board being positioned between the first main wall and the second main wall,
- a catch tab extending from the first main wall in the first direction, the catch tab being integral with the first main wall,
- a first terminating end and a second terminating end between ends of the first main wall and the second main wall, the first terminating end and the second terminating end being spaced apart from each other in the first direction and separated from each other by each of the first main wall and the second main wall, the first terminating end being adjacent to the flexible wiring and including an open end opening, and the second terminating end including a side wall connecting the first main wall to the second main wall,
- a bottom surface surrounded by the first main wall and the second main wall and the first terminating end and the second terminating end, and
- an opening opposite to the bottom surface, the opening being open to accommodate insertion of the main circuit board, wherein a main portion of the sub-circuit board extends along an exterior of the first main wall, major surfaces of the main portion of the sub-circuit board and a portion of the first main wall facing each other, wherein the flexible wiring is folded, and wherein the catch tab is configured to physically interfere with the sub-circuit board that overlaps the board holder, the catch tab pressing the sub-circuit board against the main circuit board, while the flexible wiring remains in a folded shape.

2. The battery pack as claimed in claim 1, wherein the first main wall, the second main wall, and the sidewall of the second terminating end of the board holder define a predetermined shape, an opening of the predetermined shape at the first terminating end facing an opposite direction of an open end of the folded shape of the flexible wiring.

3. The battery pack as claimed in claim 1, wherein the main circuit board is connected to the sub-circuit board through the open end opening.

4. The battery pack as claimed in claim 3, wherein the sub-circuit board is outside the board holder, the sub-circuit board extending in parallel to the first main wall of the board holder and only partially overlapping the first main wall of the board holder.

5. The battery pack as claimed in claim 1, wherein the flexible wiring passes through the open end opening and wraps around an edge of the first main wall of the board holder to connect the main circuit board with the sub-circuit board, the main circuit board and the sub-circuit board being arranged inside and outside the board holder, respectively.

6. The battery pack as claimed in claim 5, wherein the first terminating end includes a rounded portion having a rounded shape.

7. The battery pack as claimed in claim 6, wherein the flexible wiring passes through the end opening and is folded around the rounded portion of the first terminating end.

8. The battery pack as claimed in claim 1, wherein the catch tab partially overlaps the second end of the sub-circuit board, a portion of the second end of the sub-circuit board being inside the board holder.

9. The battery pack as claimed in claim 8, wherein the catch tab is contacting and pressing the portion of the second end of the sub-circuit board inside the board holder.

10. The battery pack as claimed in claim 9, wherein:
the first main wall includes a middle opening into which the portion of the second end of the sub-circuit board is insertable, and
the catch tab is a middle opening wall defining one side of the middle opening.

11. The battery pack as claimed in claim 10, wherein the middle opening is an opening in the first main wall of the board holder extending lengthwise in the first direction.

12. The battery pack as claimed in claim 10, wherein:
a main portion of the sub-circuit board is on the first main wall, and
the second end of the sub-circuit board is inserted into the first main wall through the middle opening such that the second end is fitted between the main circuit board and the catch tab.

13. The battery pack as claimed in claim 1, wherein the board holder further includes a protruding rib that protrudes from the first main wall and is configured to physically interfere with the sub-circuit board on the first main wall.

14. The battery pack as claimed in claim 13, wherein the protruding rib is at one widthwise end of the first main wall in a second direction crossing the first direction.

15. The battery pack as claimed in claim 13, wherein the sub-circuit board includes a recess into which the protruding rib is insertable.

16. The battery pack as claimed in claim 15, wherein the recess is at one widthwise end of the sub-circuit board in a second direction crossing the first direction.

17. The battery pack as claimed in claim 16, wherein the recess is in an edge of the sub-circuit board and is open in an outward direction.

18. The battery pack as claimed in claim 1, wherein:
the main circuit board is a rigid circuit board, and
the sub-circuit board and the flexible wiring are a flexible single circuit board.

* * * * *